United States Patent
Li

(10) Patent No.: US 7,225,861 B2
(45) Date of Patent: Jun. 5, 2007

(54) BUBBLE CYCLING HEAT EXCHANGER

(76) Inventor: Jia Hao Li, No. 2, Lane 127, Dang Ke St., Liu Tswo Sub-Ward, Kang Shan Jen, Kao Hsiung Hsien (TW)

( * ) Notice: Subject to any disclaimer, the term of this patent is extended or adjusted under 35 U.S.C. 154(b) by 679 days.

(21) Appl. No.: 09/912,345

(22) Filed: Jul. 26, 2001

(65) Prior Publication Data

US 2001/0040022 A1 Nov. 15, 2001

Related U.S. Application Data

(62) Division of application No. 09/477,284, filed on Jan. 4, 2000, now Pat. No. 6,789,611.

(51) Int. Cl.
*F28D 15/00* (2006.01)
(52) U.S. Cl. .................. 165/104.29; 165/80.3
(58) Field of Classification Search ............... 165/80.3, 165/104.33, 104.21, 104.26, 104.29
See application file for complete search history.

(56) References Cited

U.S. PATENT DOCUMENTS

| | | | |
|---|---|---|---|
| 3,817,321 A | 6/1974 | von Cube et al. | 165/104.33 |
| 4,625,790 A | 12/1986 | Okayasu | 165/104.29 |
| 4,930,570 A | 6/1990 | Okayasu | 165/104.29 |
| 5,458,189 A | 10/1995 | Larson et al. | 165/104.33 |
| 5,785,088 A | 7/1998 | Pai | 165/104.26 |

FOREIGN PATENT DOCUMENTS

JP 1-167594 * 7/1989 ............ 165/104.29

* cited by examiner

*Primary Examiner*—Ljiljana Ciric

(57) ABSTRACT

A bubble cycling heat exchanger includes a closed fluid loop in contact with a heat absorbing source through a heat conducting block. The loop has a bubble generator. An expanding area for generating bubbles is installed at the loop. The loop is also formed with a radiator and a guide region from which bubbles are easily separable. The heat conducting block is connected to the heat absorbing source. Since the overheating of the heat absorbing source will cause the loop to generate bubbles by an unequilibrium formed at the guide region of the loop, the bubbles will separate from the guide region so that the liquid in the loop flows for transferring heat and so that heat is radiated by the fins or other elements of the radiator from the primary element of a computer at the heat absorbing source. The loop operates continuously until a thermal equilibrium is achieved.

9 Claims, 20 Drawing Sheets

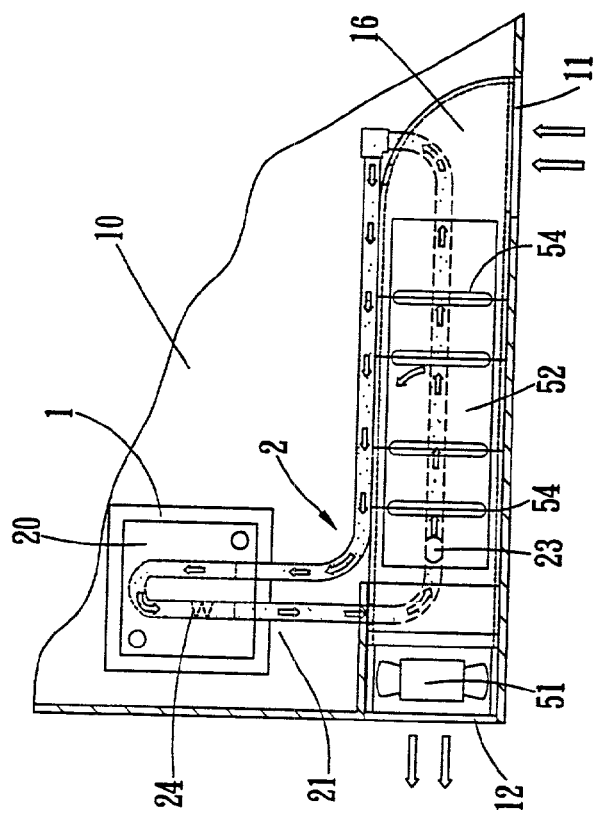
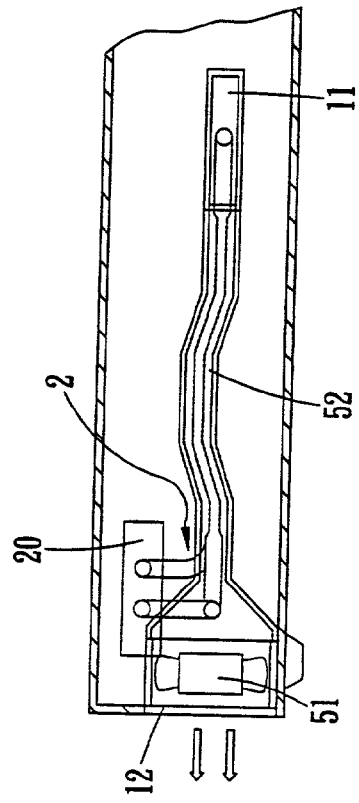
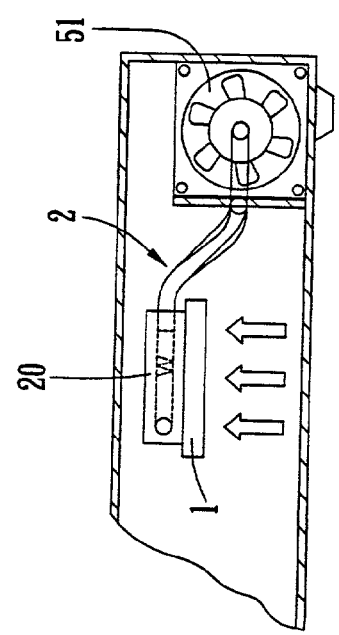
FIG. 6A
FIG. 6B
FIG. 6C

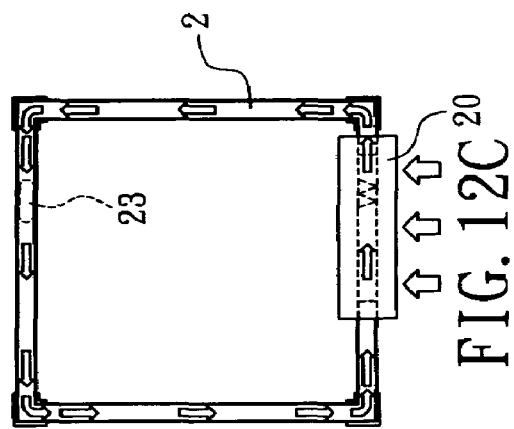
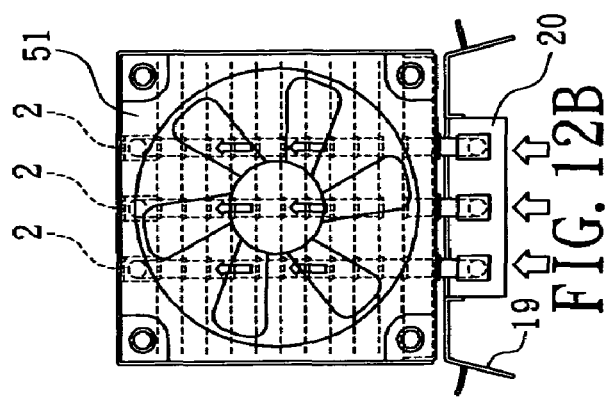
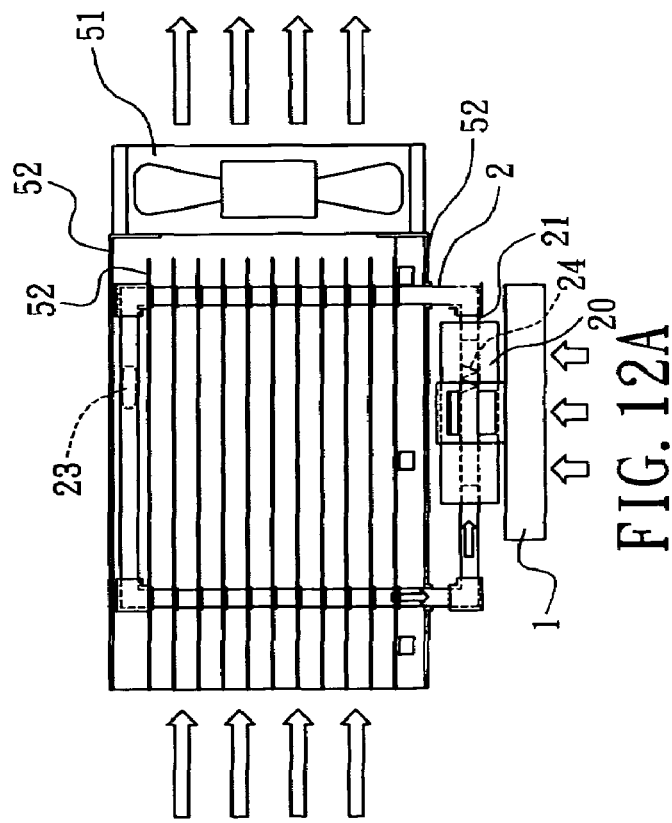
FIG. 12A
FIG. 12B
FIG. 12C

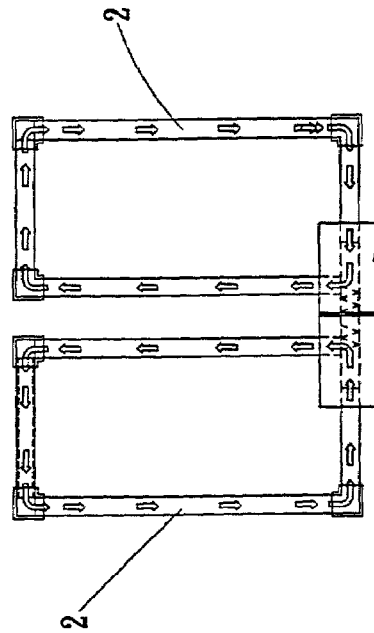
FIG. 13B
FIG. 13C
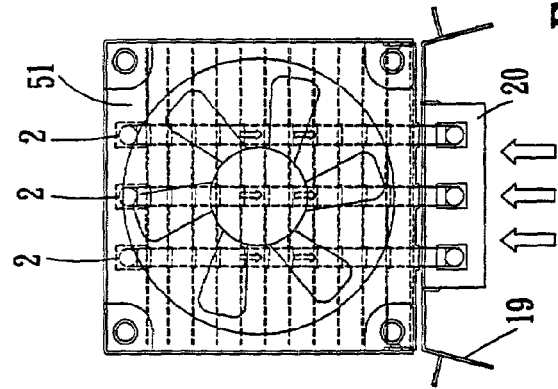
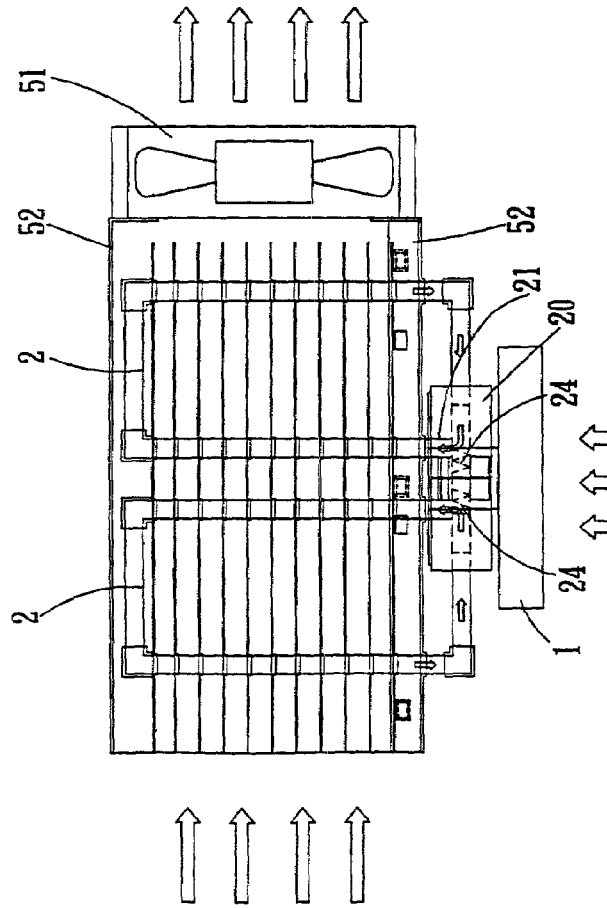
FIG. 13A

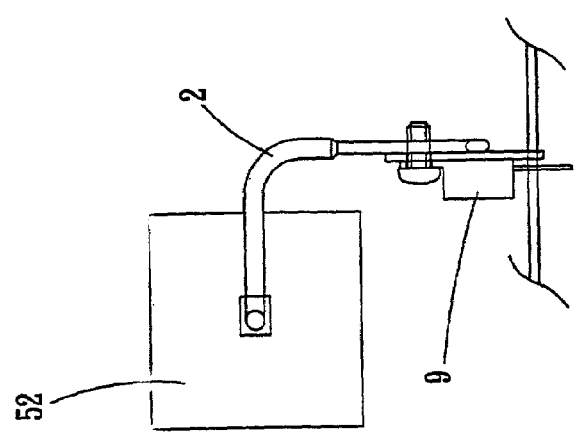
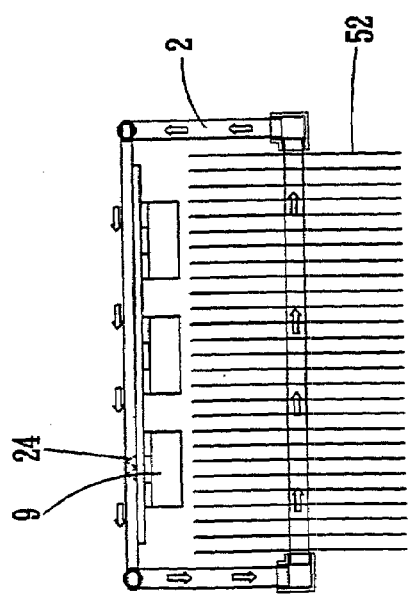
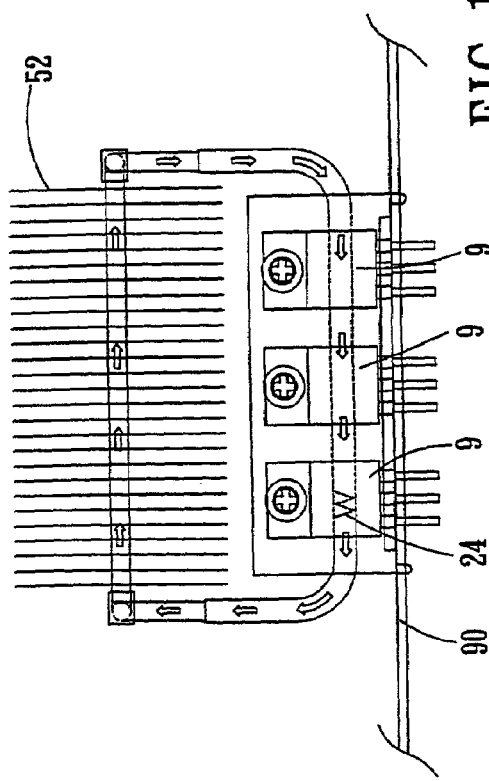
FIG. 18C
FIG. 18B
FIG. 18A

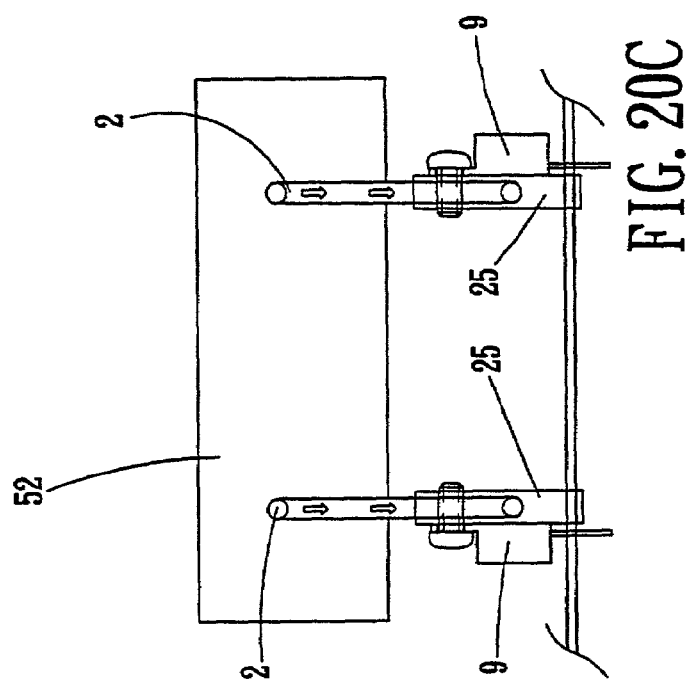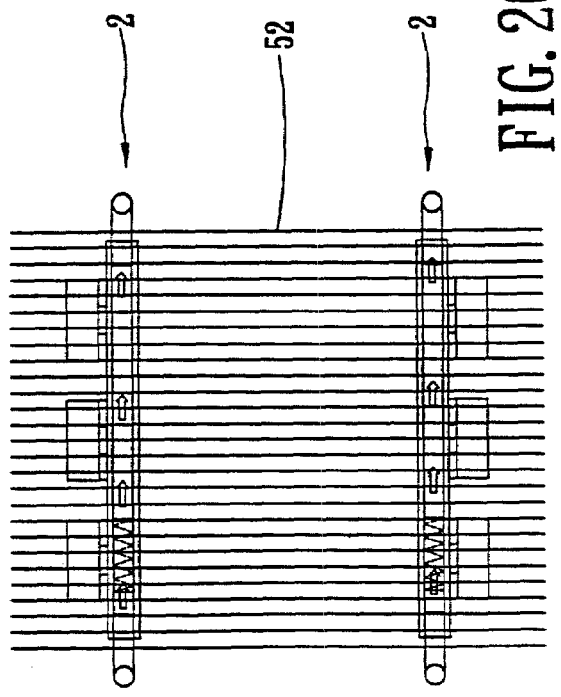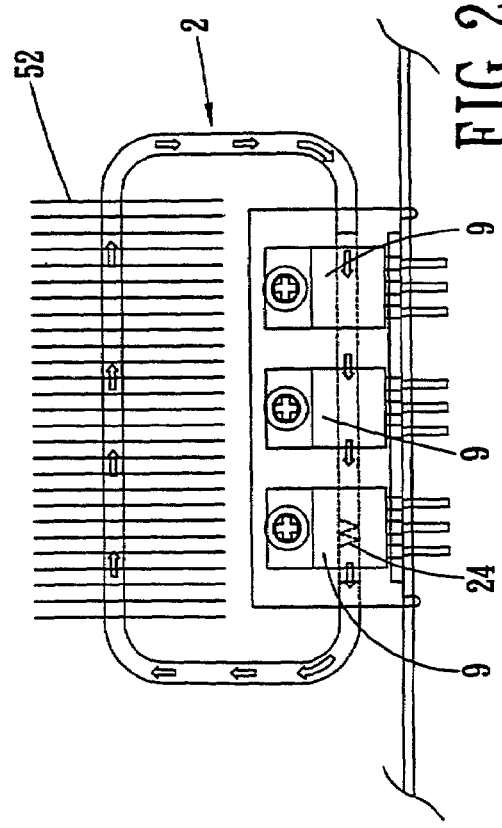

BUBBLE CYCLING HEAT EXCHANGER

This is a Divisional of Application No. 09/477,284, filed Jan. 4, 2000, now U.S. Pat. No. 6,789,611.

FIELD OF THE INVENTION

The present invention relates to a bubble cycling heat exchanger, and especially to a heat exchanger, wherein in a closed liquid pipe, the cold and heat liquids flows to as to form a preferred heat exchange.

BACKGROUND OF THE INVENTION

A prior art heat pipe radiator includes a seal vacuum chamber filled with proper working fluid. A plurality of radiating fins are installed thereon. A capillary section is installed in the chamber. The heating way is to heat one end of the pipe to boil and evaporate the working fluid. The heat is transferred from a hot section at one side to a cold section at another side. After the gas is condensed to become liquid at the cold section. The liquid flows back due to gravitation or capillary force.

Thus, due to the structure of the heat pipe, the amount of heat to be transferred will be deteriorated with the increment of an operation inclination. Due to the capillary force from the structure of the heat pipe, if overheat occurs, a dry out will be induced. Once dry out occurs, no liquid flows back so that the heating area is full of high temperature gas so that only gas phase exists. Therefore, temperature will increase dramatically so that heat supper conduction in the heat pipe fail and thus the effect is reduced greatly. Furthermore, the non-condensing gas in the heat pipe must be removed completely otherwise super conduction will be affected. Moreover, since an operation inclination exist, the heat pipe is possibly moved or folded. Accordingly, it is apparent that heat pipe has some original disadvantages necessary to be improved.

SUMMARY OF THE INVENTION

Accordingly, the primary object of the present invention is to provide a bubble cycling heat exchanger, wherein the vapor will expand so that bubble will separate and thus generate a push force. Thus, fluid in a seal loop will flow so as to transfer heat from one radiating section of electronic elements to another radiating section. Then, the fluid will flow back to the original position. Many different designs are used for being used in a computer so as to improve the radiating effect. Therefore, a higher radiating requirement of a computer is achieved.

In order to achieve the above said objects, a bubble cycling heat exchanger is disclosed in the present invention. A closed fluid loop is in contact with a heat absorbing source through a heat conducting block; the loop has a bubble generator, an expanding area for generating bubbles is installed at loop; the loop is also formed with a guide region from which bubbles is easily separable and a radiator; a heat conducting block of the closed loop is connected to a heat absorbing source; since the overheat of the heat absorbing source will cause the loop to generate bubble; by an unequilibrium formed at the guide region of the loop, the bubbles will separate from the heat absorbing source so that the liquid in the loop flows for transferring heat so that heat is radiated by the fins or other elements of the radiator from the primary element of a computer at the heat absorbing source, the loop operates continuously until a heat equilibrium is achieved.

The various objects and advantages of the present invention will be more readily understood from the following detailed description when read in conjunction with the appended drawing.

BRIEF DESCRIPTION OF THE DRAWINGS

FIG. 6A is an upper cross sectional view of the sixth embodiment according to the present invention.

FIG. 6B is a front cross sectional view of the sixth embodiment according to the present invention.

FIG. 6C is a left cross sectional view of the sixth embodiment according to the present invention.

FIG. 12A is a front view of the 12th embodiment according to the present invention.

FIG. 12B is a right cross sectional view of the 12th embodiment according to the present invention.

FIG. 12C is a front view of the 12th embodiment without fin according to the present invention.

FIG. 13A is a front view of the 13th embodiment according to the present invention.

FIG. 13B is a right cross sectional view of the 13th embodiment according to the present invention.

FIG. 13C is a front view of the 13th embodiment without fin according to the present invention.

FIG. 18A is a front view of the 18th embodiment according to the present invention.

FIG. 18B is an upper view of the 18th embodiment according to the present invention.

FIG. 18C is a right view of the 18th embodiment according to the present invention.

FIG. 20A is a front view of the 20th embodiment according to the present invention.

FIG. 20B is an upper view of the 20th embodiment according to the present invention.

FIG. 20C is a right view of the 20th embodiment according to the present invention.

DETAILED DESCRIPTION OF THE PREFERRED

Embodiments

Figure 1A:
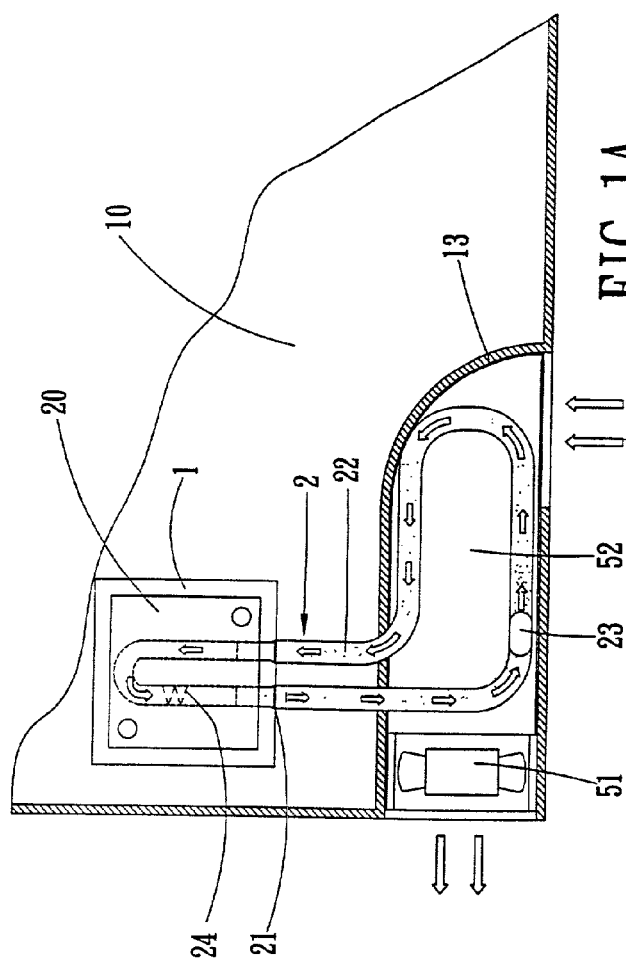
FIG. 1A is an upper cross sectional view of the first embodiment according to the present invention.

With reference to FIGS. 1 to 6, six embodiments about the first kind of the bubble cycling heat exchanger of the present invention are illustrated. In the present invention, a closed fluid loop 2 is contacted with a heat absorbing source 1 through a heat conducting block 20. The loop 2 is filled of liquid 22. In the bubble generator 24, an expanding area 23 for generating bubbles is installed at loop 2. The loop 2 is also formed with a guide region from which bubbles is easily separable and a radiator 5. The heat conducting block 20 at one end of the closed loop 2 is connected to a heat absorbing source 1. The primary elements of the notebook computer is on the surface of a central processing unit, in generally, which is locked to the central processing unit (the type shown in the figure) by two screws. The heat conducting block 20 can be fixed by a buckle. Another end of the loop 2 is connected to a radiator 5. The heat conducting block 20 at the center of the loop 2 has a bubble generator 24. Since the overheat of the heat absorbing source 1 will cause the loop 2 to generate bubble. By an unequilibrium formed at the guide region 21 of the loop, the bubbles will separate from the heat absorbing source so that the liquid 22 in the loop 2 flows for transferring heat so that heat is radiated by the radiator 5. The loop 2 operates continuously to an heat equilibrium condition. An inlet for liquid 3 must be installed at the loop 2, which is a necessary device for the loop, but is a secondary factor. The radiator 5 can be assembled with a machine body 10, a wind inlet 11, a wind channel 13, a wind outlet 12, a radiating fin 52, and a blower 51 for forming different embodiment.

Figure 1B:
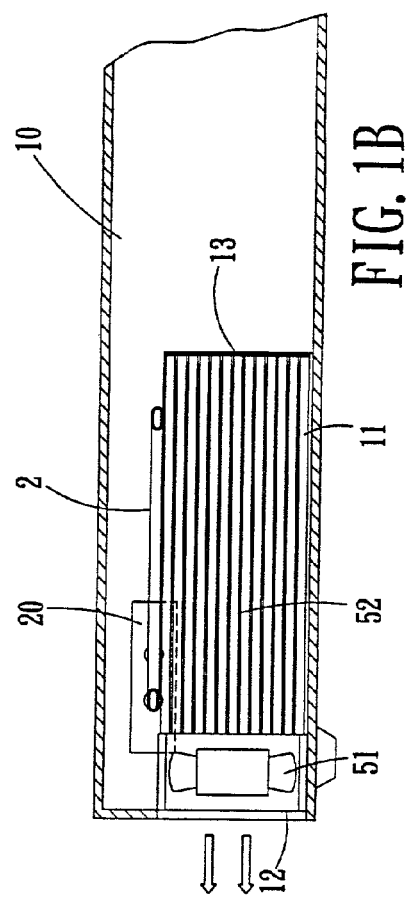
FIG. 1B is a front cross sectional view of the first embodiment according to the present invention.
Figure 1C:
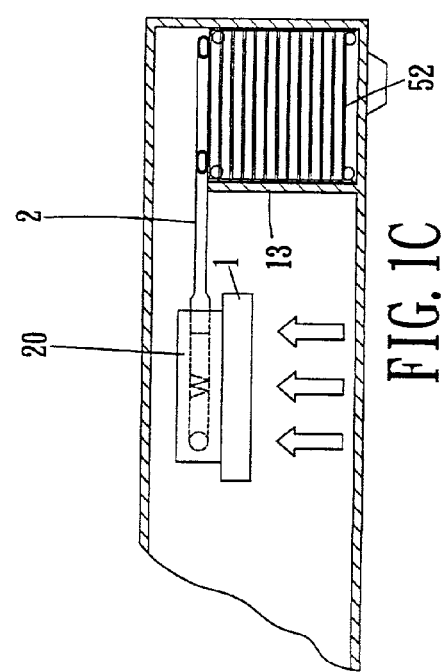
FIG. 1C is a left cross sectional view of the first embodiment according to the present invention.

The first embodiment of the present invention is shown in FIGS. 1A, 1B and 1C. The heat conducting block 20 is installed with an input channel. A bubble generator 24 is installed at the channel at one side. Matching with the radiator 21 at an outlet channel, the heat absorbing bubbles will flow out from the guide region 21, and then the bubbles flows through one cycle at a pipe to return to the inlet channel. The pipe in the loop 2 passes through the wind channel 13. The pipe is supported on a fin set 52 having many pieces of fins with heat transferring function with each other so as to radiating heat from the radiator 5. A cover with parallel spacers (not shown) is installed at the wind inlet 11 and wind outlet 12. Thereby, the cold air at the wind inlet 11 will be absorbed by an axial flow blower 5 at the wind outlet 12 so as to heat exchange at the wind channel 13. Then, hot air is guided to flow out from the wind outlet 12.

Figure 2A:
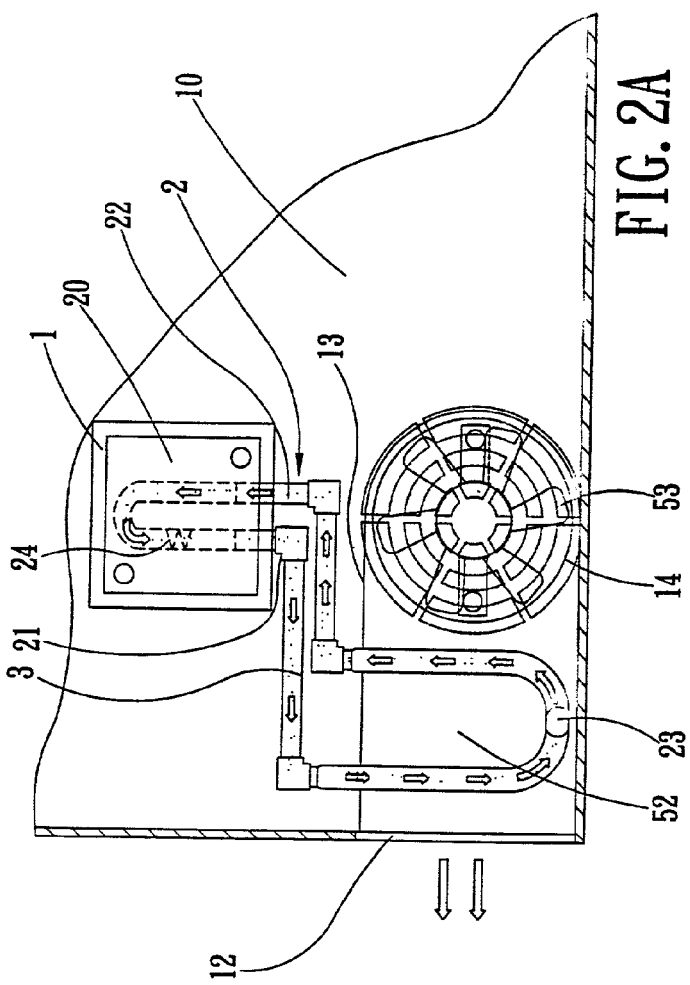
FIG. 2A is an upper cross sectional view of the second embodiment according to the present invention.
Figure 2B:
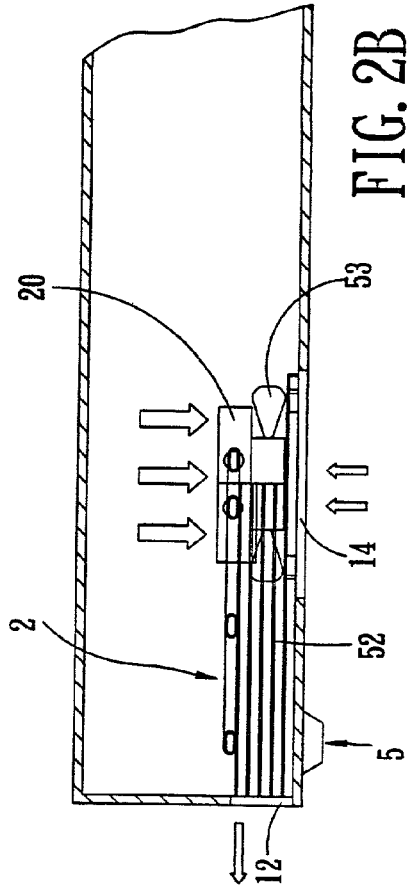
FIG. 2B is a front cross sectional view of the second embodiment according to the present invention.
Figure 2C:
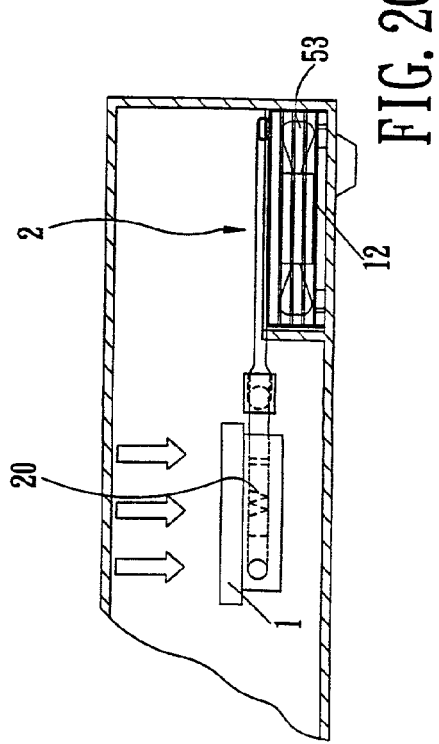
FIG. 2C is a left cross sectional view of the second embodiment according to the present invention.
Figure 3A:
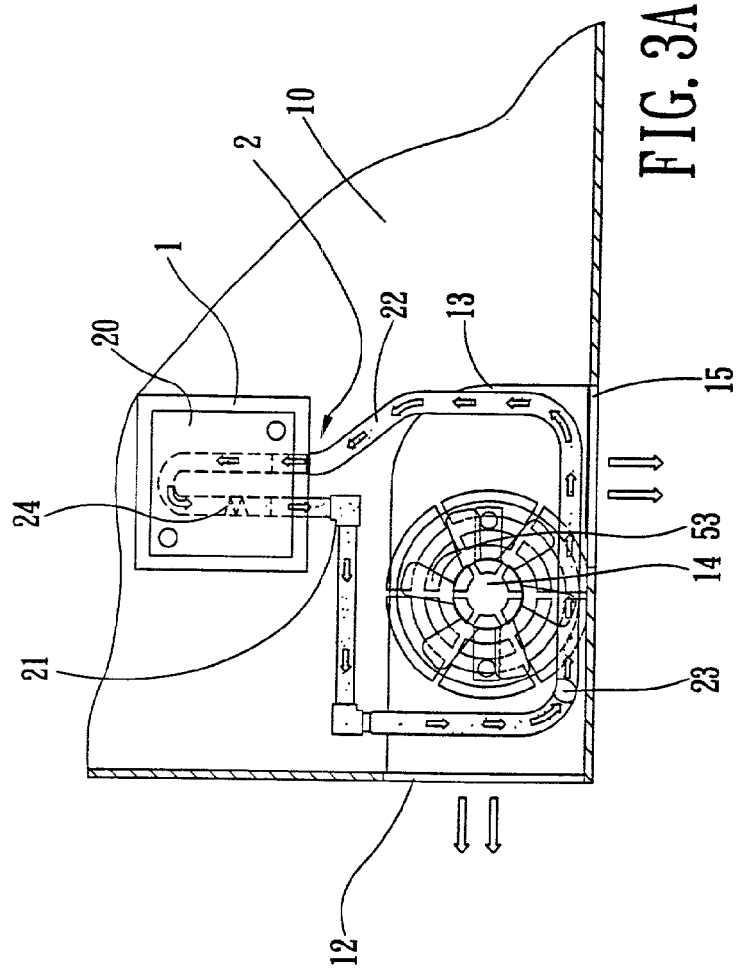
FIG. 3A is an upper cross sectional view of the third embodiment according to the present invention.
Figure 3B:
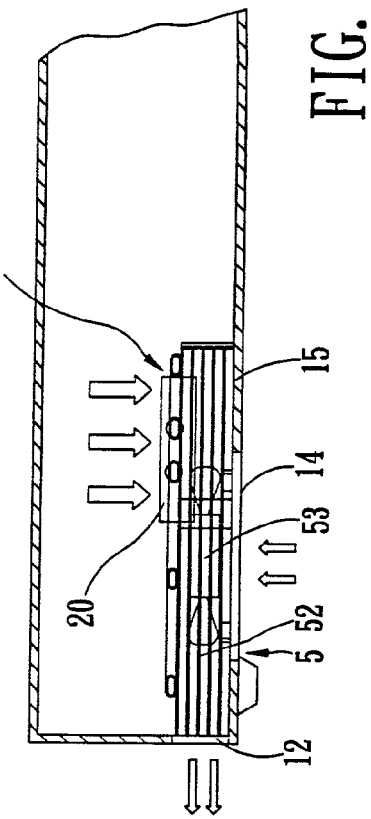
FIG. 3B is a front cross sectional view of the third embodiment according to the present invention.
Figure 3C:
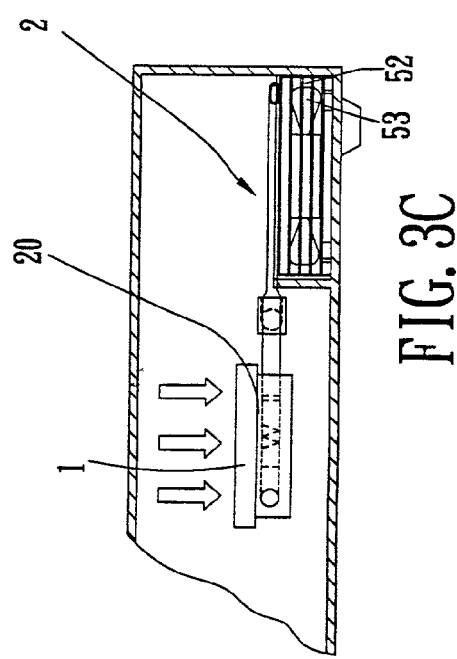
FIG. 3C is a left cross sectional view of the third embodiment according to the present invention.
Figure 4A:
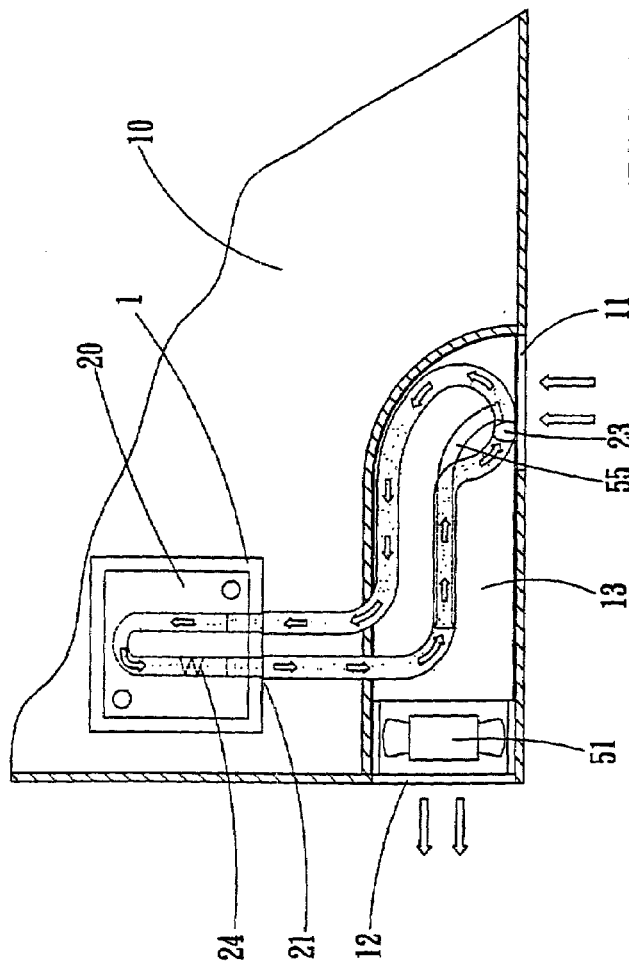
FIG. 4A is an upper cross sectional view of the fourth embodiment according to the present invention.
Figure 4B:
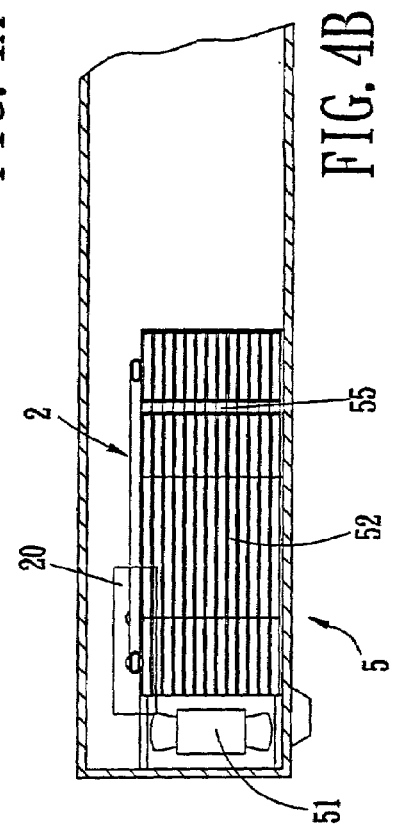
FIG. 4B is a front cross sectional view of the fourth embodiment according to the present invention.
Figure 4C:
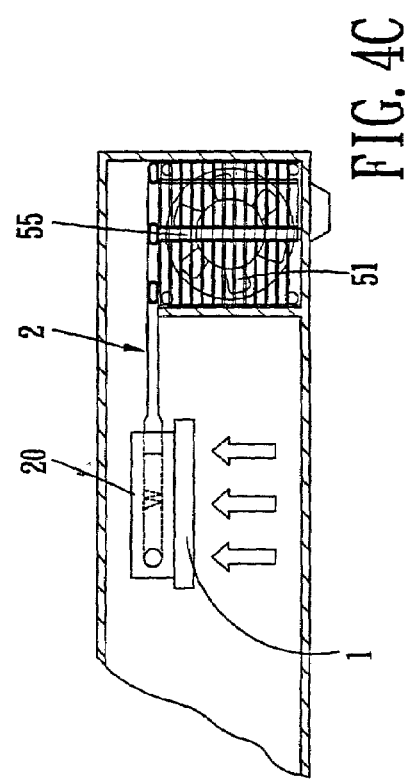
FIG. 4C is a left cross sectional view of the fourth embodiment according to the present invention.

The difference of FIG. 2 from FIG. 1 is that the wind channel is smaller so that the lateral wind inlet 11 at the first embodiment is changed to a bottom wind inlet 14. The machine body 10 is suspended at the bottom thereof. The difference of FIG. 3 from FIG. 1 is the blower is installed at the bottom wind inlet 14 of the machine body 10, while the wind inlet 14 is at the middle section of the wind channel 13. Two sides of the wind channel have respective lateral wind outlet 12 and 15 so that wind can be drained out rapidly, that is, heat can be radiated more rapidly. The difference of FIG. 4 from FIG. 1 is a conducting piece 55 is further installed at the loop, which is adhered to the bottom surface of the loop, and then passes through the fin set 52 for conducting heat to each fin 52. The difference of FIG. 5 from FIG. 4 is two heat conducting pieces 56 and 57 are installed at the loop, and each heat conducting piece passes through the fin set 52 for speeding heat transferring. FIG. 6 is more special, which is installed with a wind channel 16, moreover, the loop passes through the fin 52. Therefore, a through hole 54 is installed at the fin 52 for meeting the requirement of a bending channel.

Figure 7A:
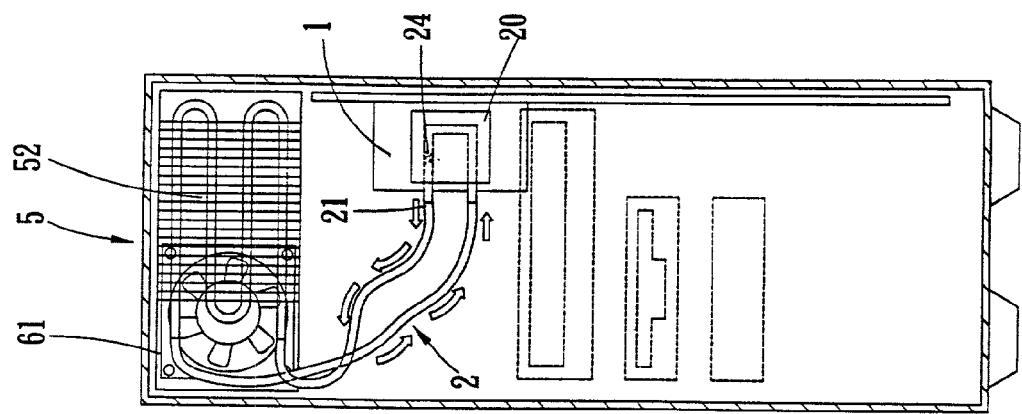
FIG. 7A is a front cross sectional view of the seventh embodiment according to the present invention.
Figure 7B:
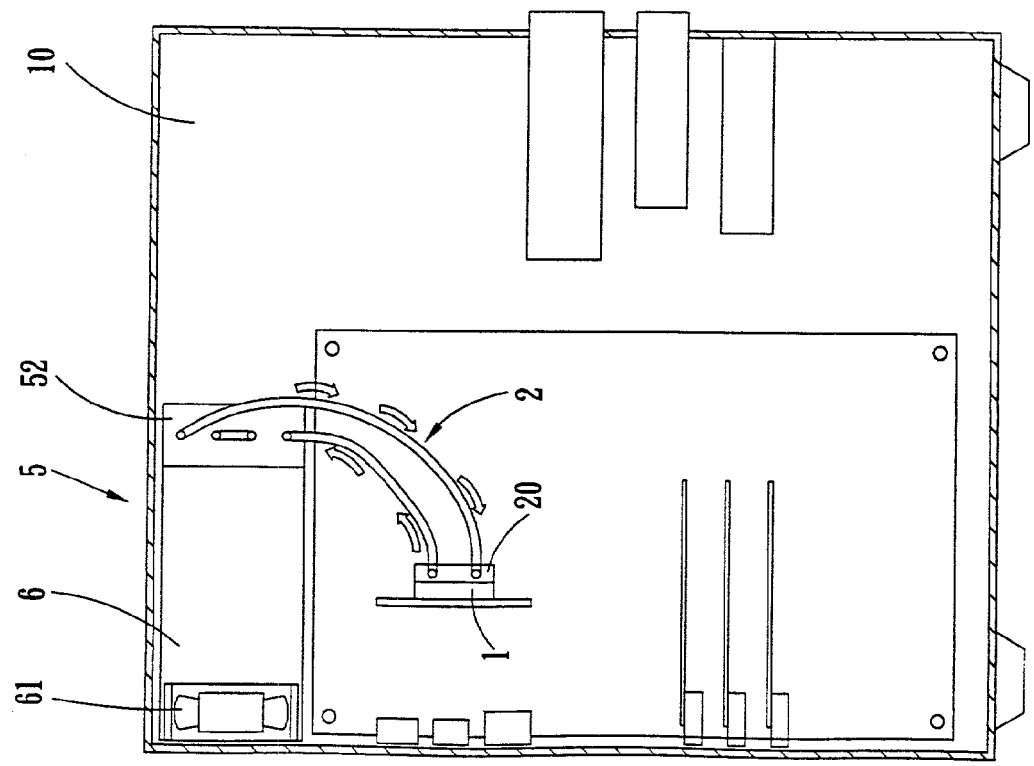
FIG. 7B is a left cross sectional view of the seventh embodiment according to the present invention.
Figure 8A:
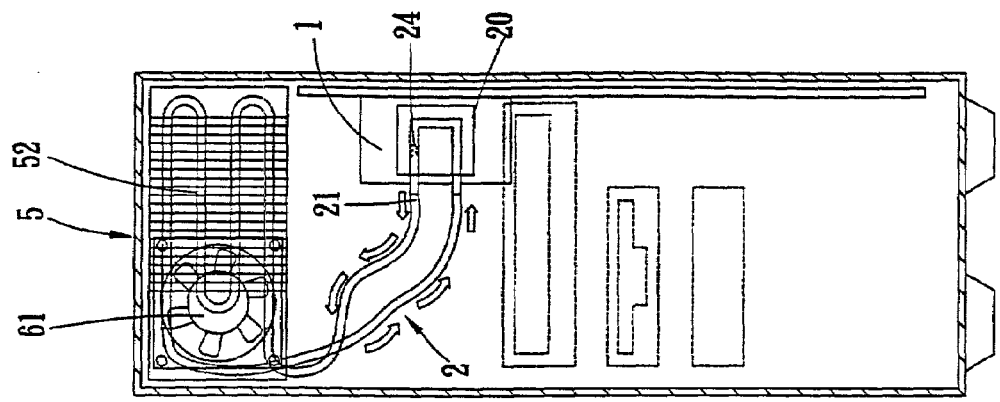
FIG. 8A is a front cross sectional view of the eighth embodiment according to the present invention.
Figure 8B:
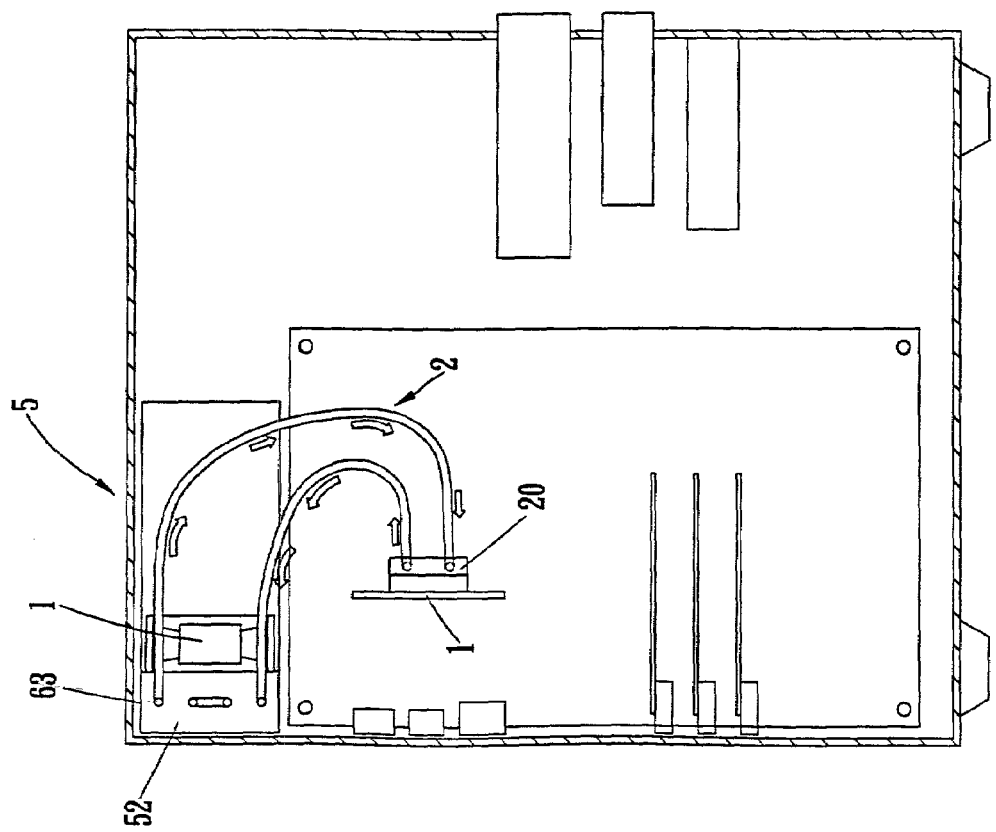
FIG. 8B is a left cross sectional view of the eighth embodiment according to the present invention.
Figure 9A:
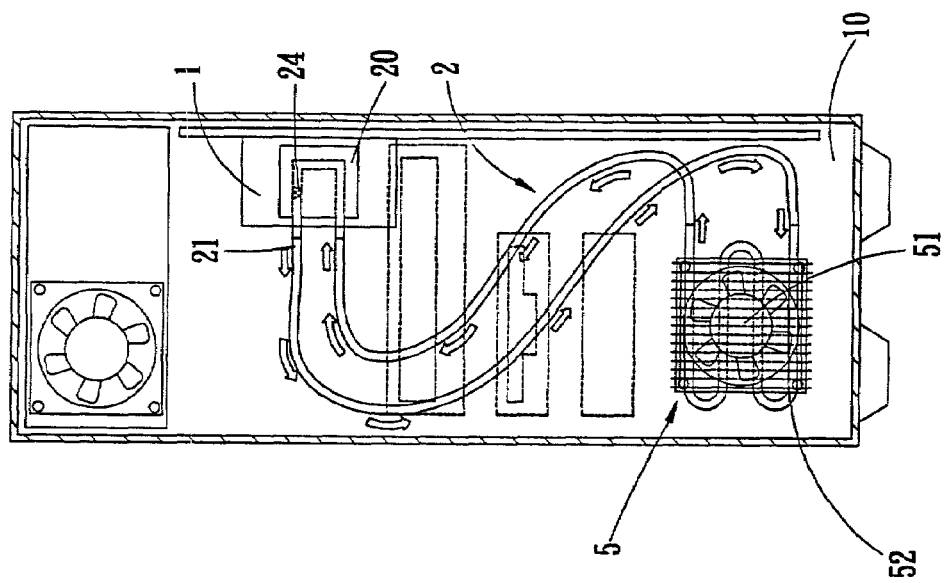
FIG. 9A is a front cross sectional view of the ninth embodiment according to the present invention.
Figure 9B:
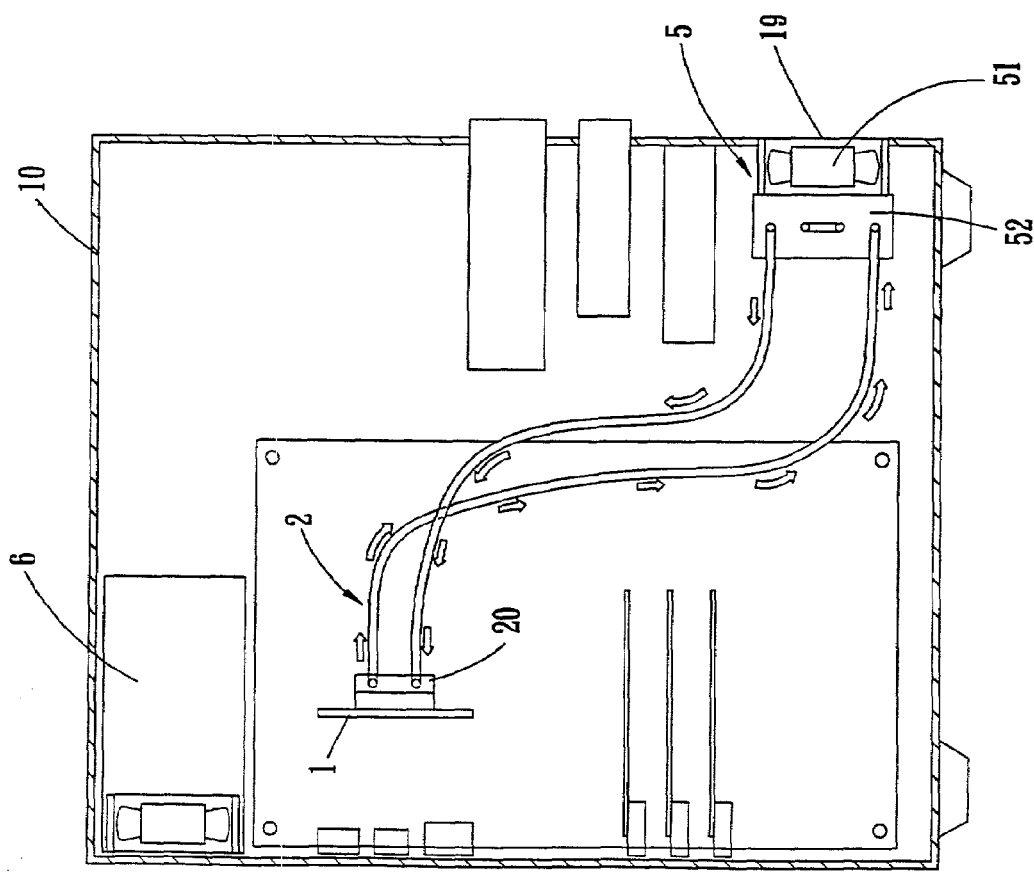
FIG. 9B is a left cross sectional view of the ninth embodiment according to the present invention.
Figure 10A:
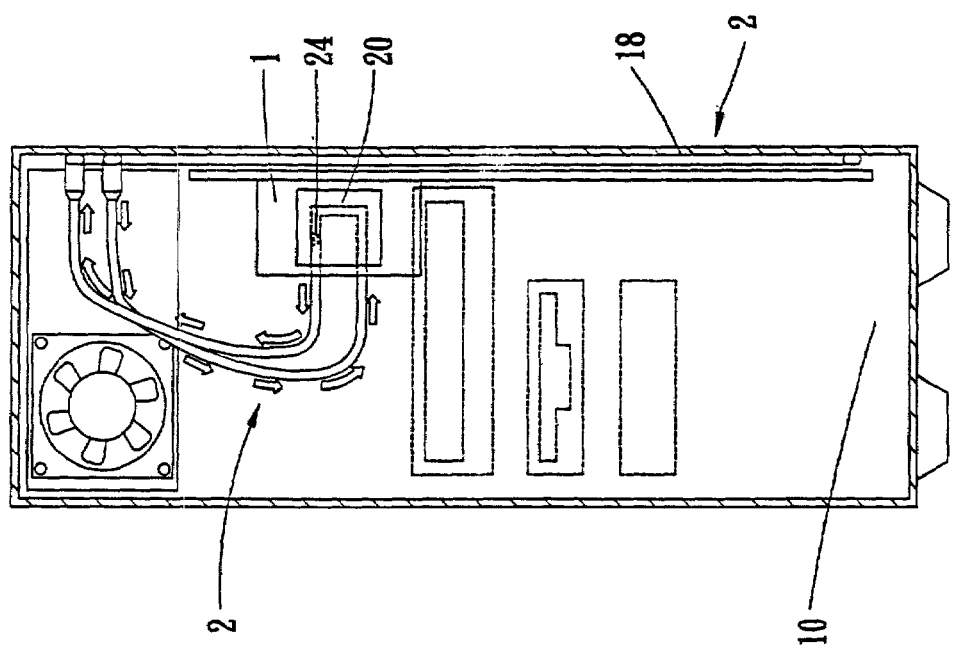
FIG. 10A is a front cross sectional view of the tenth embodiment according to the present invention.
Figure 10B:
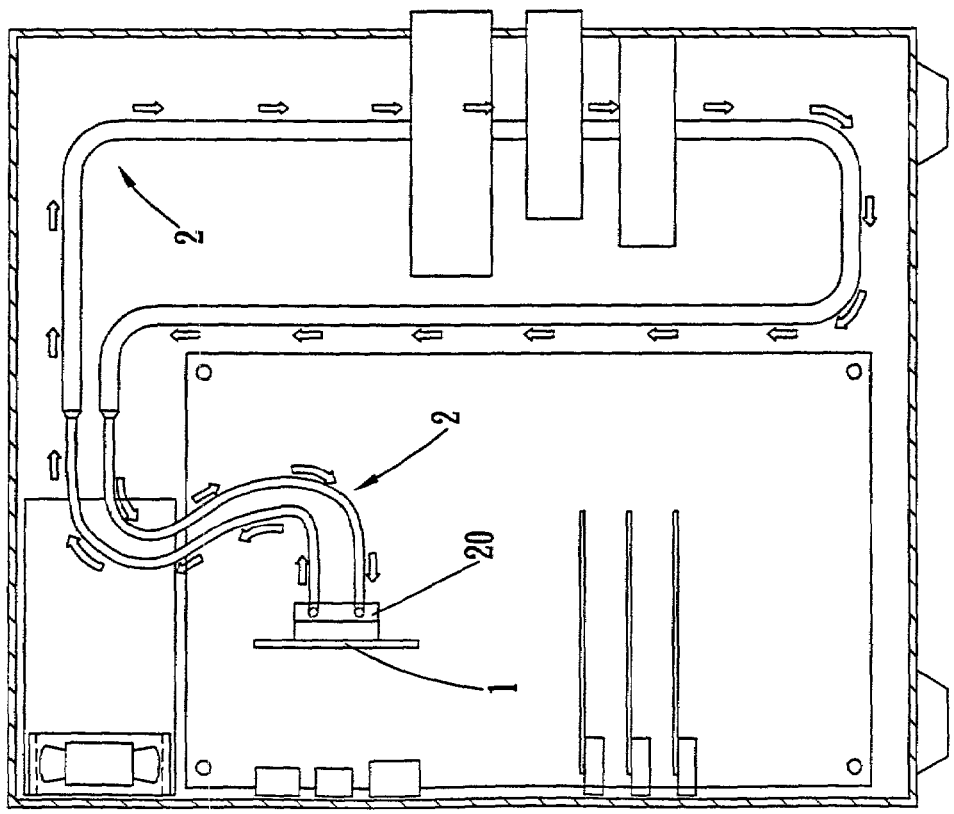
FIG. 10B is a left cross sectional view of the tenth embodiment according to the present invention.
Figure 11A:
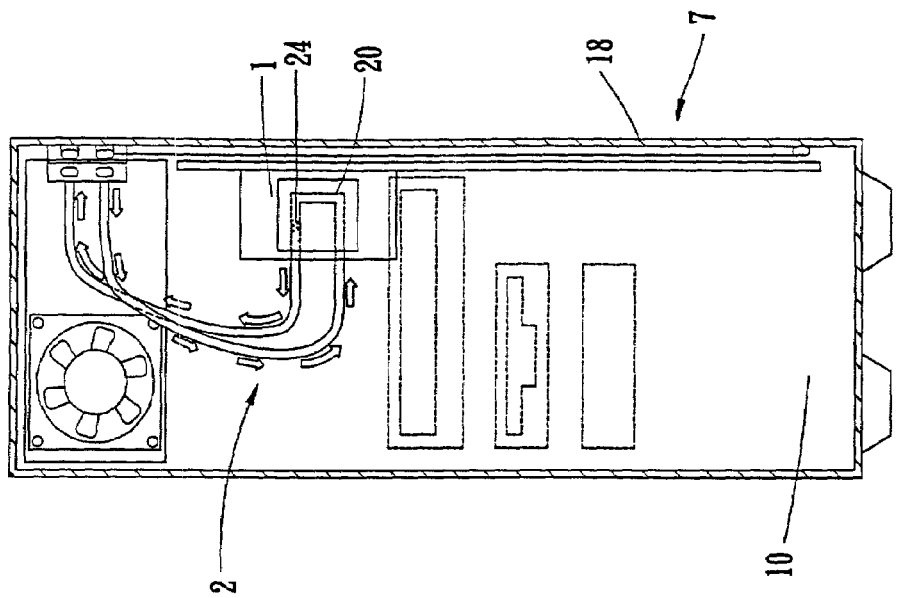
FIG. 11A is a front cross sectional view of the eleventh embodiment according to the present invention.
Figure 11B:
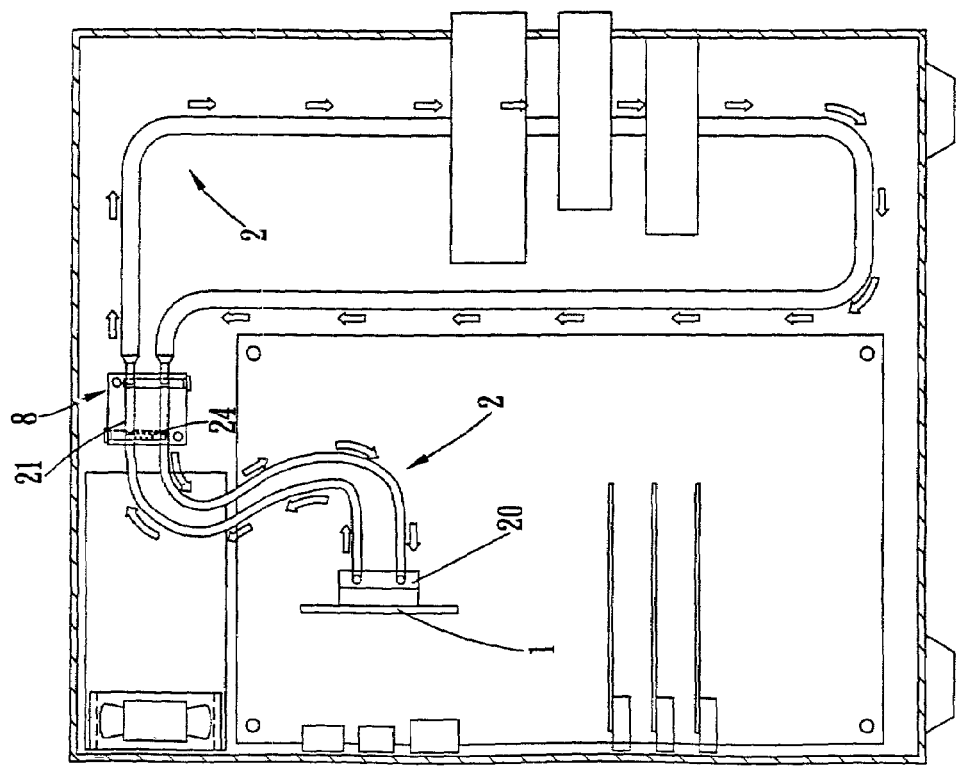
FIG. 11B is a left cross sectional view of the eleventh embodiment according to the present invention.
Figure 14B:
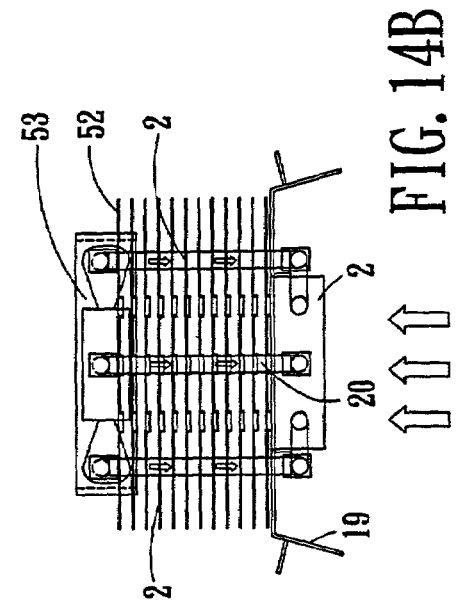
FIG. 14B is a right view of the 14th embodiment according to the present invention.
Figure 14C:
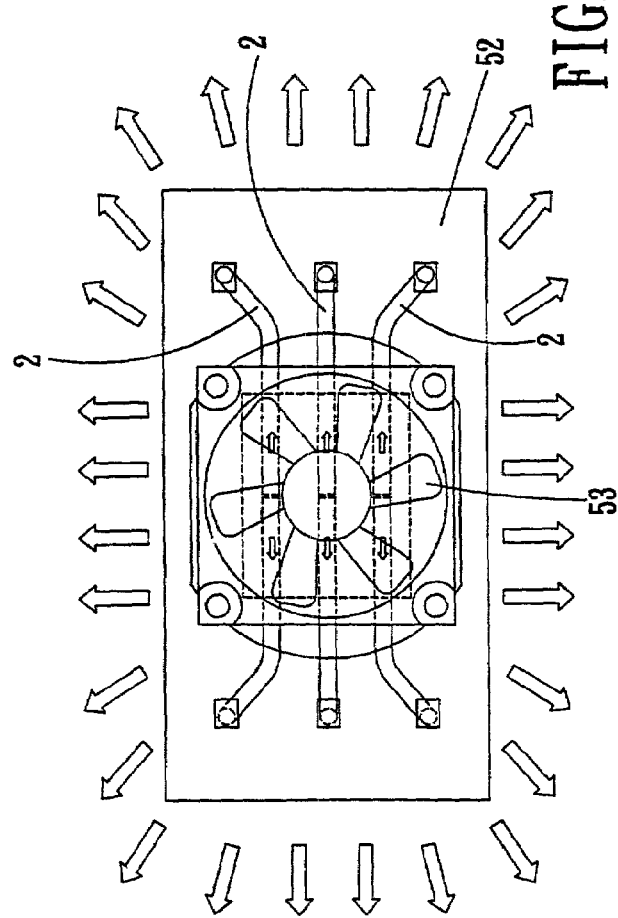
FIG. 14C is an upper view of the 14th embodiment according to the present invention.
Figure 14A:
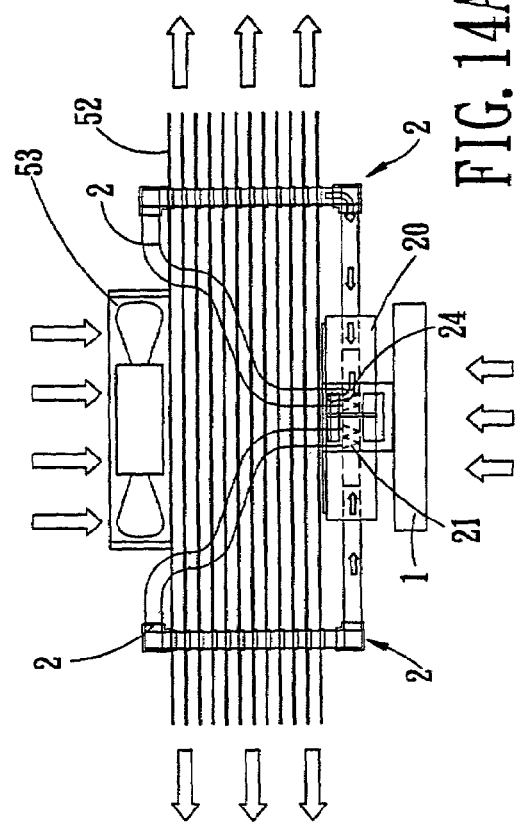
FIG. 14A is a front view of the 14th embodiment according to the present invention.
Figure 15B:
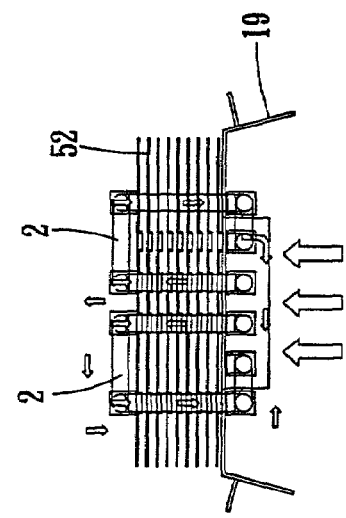
FIG. 15B is a right view of the 15th embodiment according to the present invention.
Figure 15C:
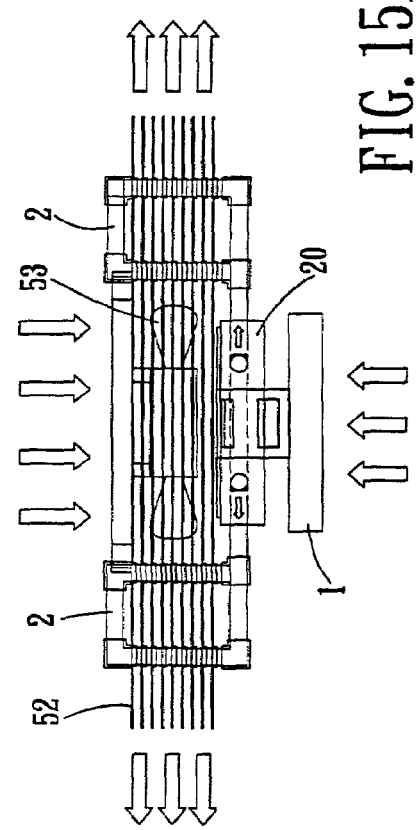
FIG. 15C is an upper view of the 15th embodiment according to the present invention.
Figure 15A:
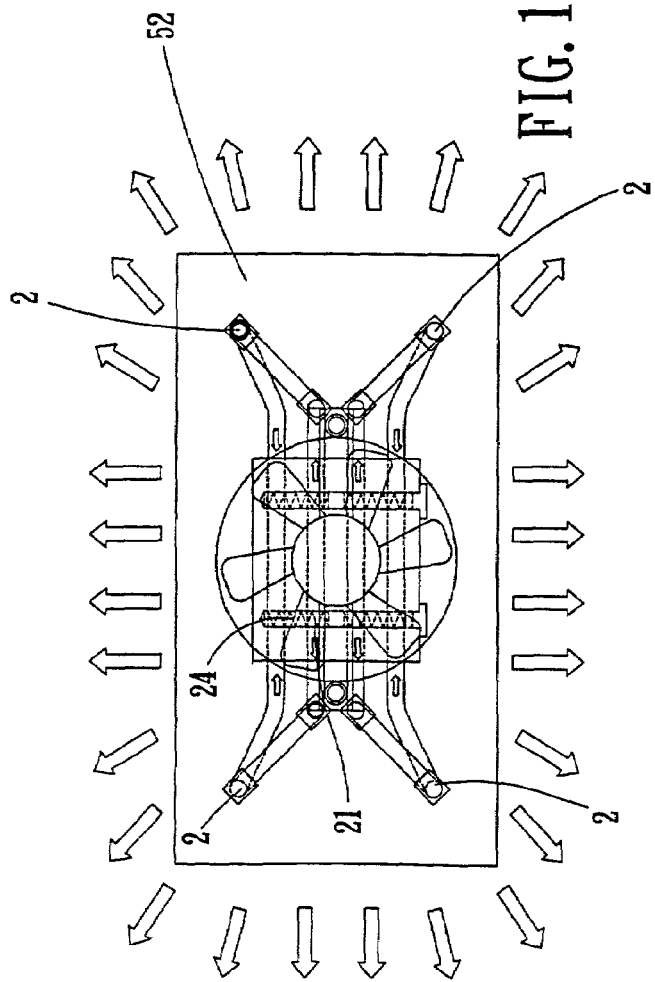
FIG. 15A is a front view of the 15th embodiment according to the present invention.

The second embodiment of the present invention is shown in FIGS. 7 to 11, and this embodiment is applied to a central processing unit. The primary of this embodiment is similat to that of FIG. 1. The loop 2 passes with fin set 52. After heat is conducted out from the central processing unit CPU of heat absorbing source 1, the radiator 5 is formed as a blower 61 of the power supply 6. In FIG. 7, the fin 52 is assembled in the wind inlet 62 in front of the power supply 6. As shown in FIG. 8, the fin set 52 is assembled to the wind outlet 63 at the rear side of the blower 61 of the power supply 6. See FIG. 9, a further blower 51 and a front wind outlet 17 are installed at the front lower side of the machine body 10. In these three embodiments, a blower 51 or 61 is necessary for achieving the object of pumping air for cooling. The radiator 5 at FIG. 10 is the housing 10 of a computer or a seat. The loop 2 is adhered to one lateral plate 18 of the housing 10, then the metal lateral plate 18 serves to radiate heat. The difference of FIG. 11 from FIG. 10 is that the loop 2 is further installed with an indirect loop 7. Namely, two loops 2 and 7 are connected in series for conducting heat so that the pipes on the loops can be fixed or connected in series conveniently. Namely, an indirect loop 7 is installed at the lateral plate 18, and a primary loop 2 is connected from the heat conducting block 20 connected to the central processing unit 1. The two loops 2 and 7 are connected by a heat conducting body 8 having a function identically to the heat conducting block 8. The heat conducting body 8 will cause the product to be installed conveniently and be connected in series conveniently.

Figure 16B:
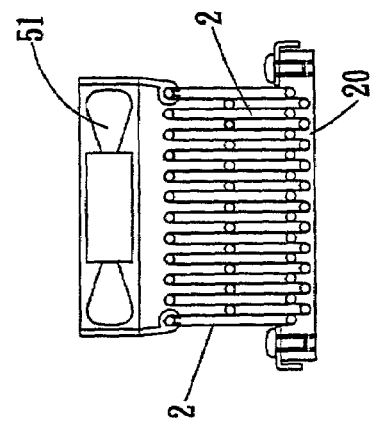
FIG. 16B is an upper view of the 16th embodiment according to the present invention.
Figure 16C:
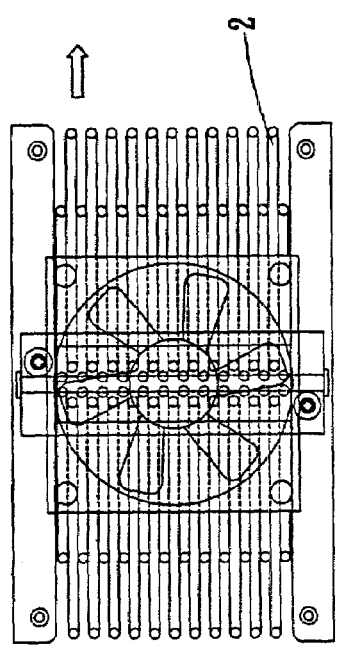
FIG. 16C is a right view of the 16th embodiment according to the present invention.
Figure 16A:
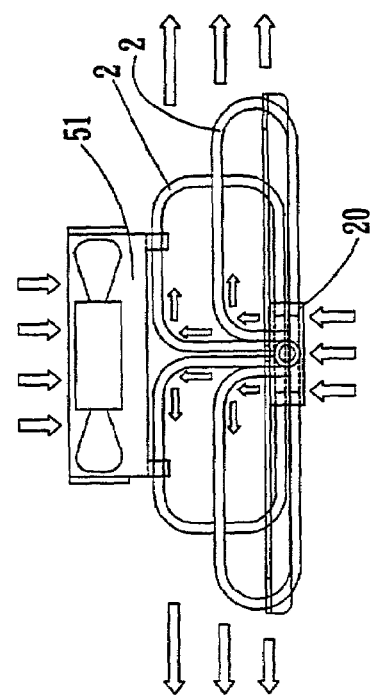
FIG. 16A is a front view of the 16th embodiment according to the present invention.
Figure 17C:
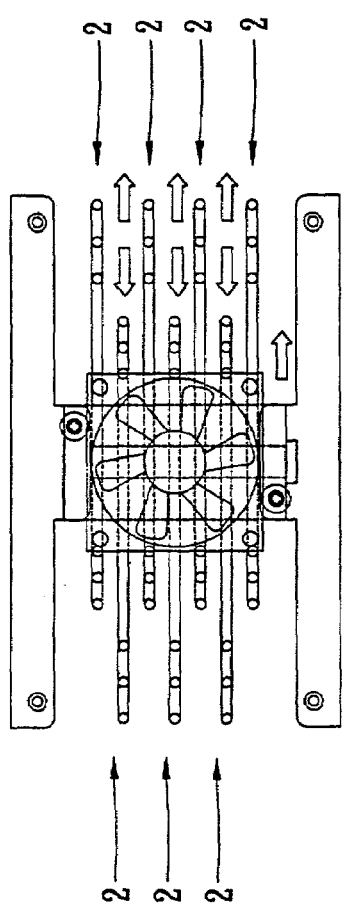
FIG. 17C is a right view of the 17th embodiment according to the present invention.
Figure 17B:
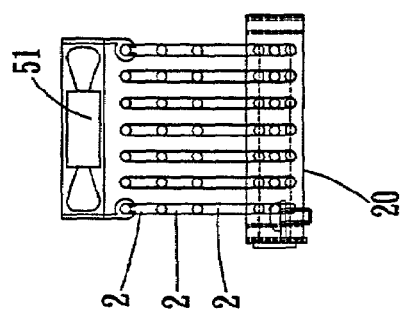
FIG. 17B is an upper view of the 17th embodiment according to the present invention.
Figure 17A:
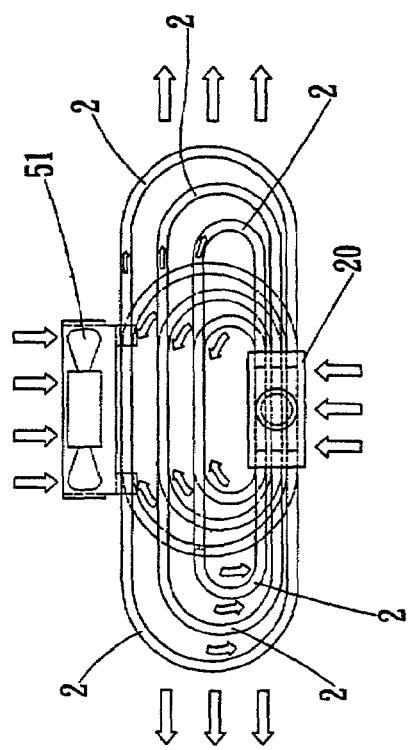
FIG. 17A is a front view of the 17th embodiment according to the present invention.

The third embodiment of the present invention is shown in FIGS. 12 to 17, wherein the heat is radiated from the heat absorbing source 1 on the central processing unit. The primary structure of this embodiment is similar to that of FIG. 1. In FIG. 12, three loops 2 are connected in parallel, In the assembly of loop 2, a plurality of fins 52 serves to be formed as a fin set. Each fins 52 is buckled to the pipe of the loop through a matched round ring by welding or sticky which is determined by the material of the pipes. The heat absorbing source 1 is connected to the heat conducting block 20 by a clip buckle 19. One side of the top piece or bottom piece of the fin set is extended with four corners of the blower 51 for forming a transversal air flow so as to assembly with the fins 52, and thus, a better radiator 5 is formed. The difference of FIG. 13 from FIG. 12 is that six loop parallel connecting structure is installed, but blower 52 is connected to be above the top plate of the fin 52. Then, each fin is installed with vent so that air may flow downwards and transversally outwards. Only the way for pumping wind is different so that the installation work is easily. Moreover, that shown in FIG. 15 has four loops 2. The blower 52 is inversely suspended from the lower side of the top plate in the fin 52. Each fin 52 is installed with via hole and a containing space for containing the blower 53, and thus the volume of the radiator 5 is reduced and a preferred radiating effect is achieved. Furthermore, as that shown in FIG. 16 and FIG. 17, the example shown is different from that described above wherein fins 52 is the primary body for radiating. In this example, the loop 2 is the body for radiating, thus radiating pipes are more that aforesaid examples. In FIG. 16, 46 loops are used with 23 loops at each side. The heat conducting blocks are arranged in the upper and lower layers, and the loops are arranged in the higher and lower spaces. Each of four corners of the high and low loops is installed with a respective blower 51. In FIG. 17, 21 sets of loops (three layers with each layer has seven loops) are alternatively arranged at two sides. Each loops 2 is a three layer arrangement to the heat conducting block so as to complete the radiating effect without any fin so that the loops can be assembled easily and conveniently. Thus, the cost is reduced. Each of the four corners of the high loops is installed with a respective blower 51. At the same position, the loops of different layer have an identical flow direction, while adjacent sets have opposite flow directions.

Figure 19C:
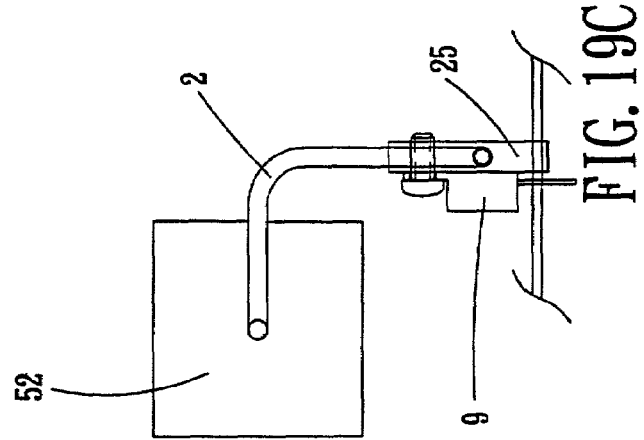
FIG. 19C is a right view of the 19th embodiment according to the present invention.
Figure 19B:
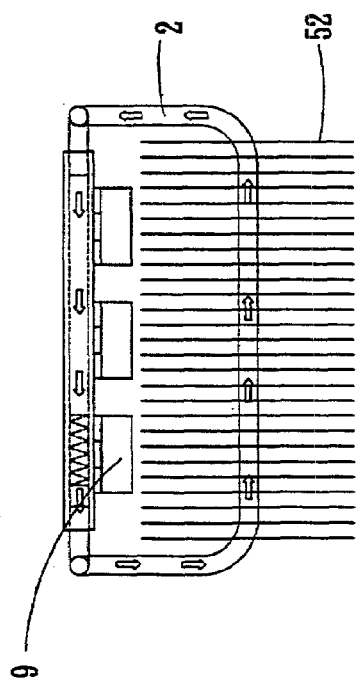
FIG. 19B is an upper view of the 19th embodiment according to the present invention.
Figure 19A:
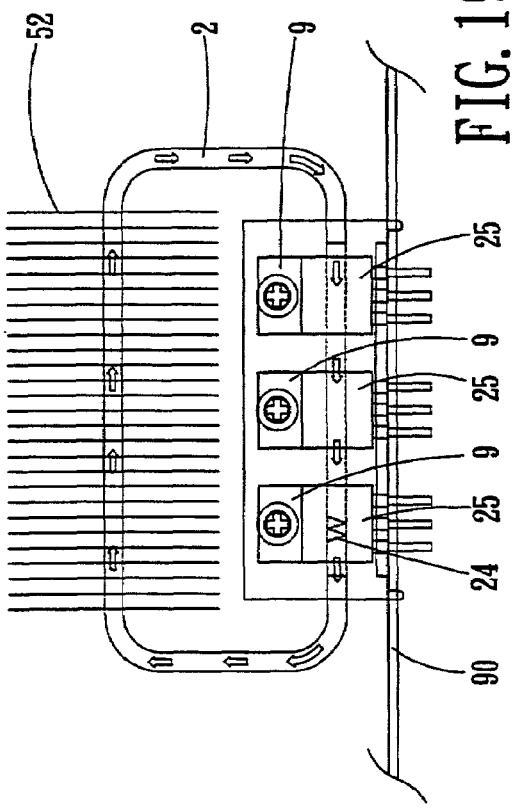
FIG. 19A is a front view of the 19th embodiment according to the present invention.

The fourth embodiment of the present invention is shown in FIGS. 18 to 20. In this the present invention, the heat is radiated directly from the radiating element 9 at the seat 90 of a personal computer 90. The primary structure in loop 2 is similar to that in FIG. 1, the loop 2 is contacted with at least the surface of the radiating element 9 (FIG. 18) or passes through a hole (FIG. 19) of a small heat conducting block 25. The loops in this two embodiments have a plurality of fins 52. Since the copper or aluminum portions of the radiating element 9 may radiate heat directly. The loop is connected to a related position so that heat is dissipated from a larger radiator 5. FIG. 20 shows a two loop structure which are connected in parallel and have a common fin set 52.

The bubble cycling heat exchanger of the present invention includes a closed flow loop 1 and a bubble generator 6, an expanding section 4 for providing liquid 3 to loop 2 for generating bubbles 5. When one end of the closed loop 2 is connected to a heat source 1. Another end is connected to a radiator 5. The loop 2 has a bubble generator 6. Since overheat will cause the loop 2 to generate bubbles, as unequilibrium formed in the guide region in the loop occurs, the bubble separates from the heat absorbing source rapidly so that the liquid 3 in the loop flows so as to transfer heat. By the radiator 5, the heat will be conducted. The loop operates continuously until heat equilibrium is achieved. The loop 2 must be installed with an inlet 7 for the liquid 3. This is a necessary loop device, but is a secondary factor.

Figure 5A:
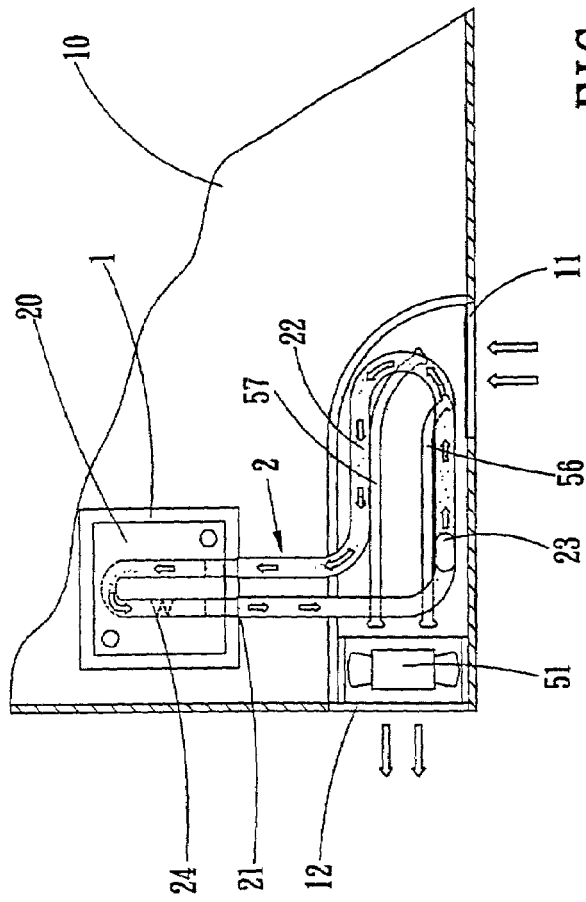
FIG. 5A is an upper cross sectional view of the fifth embodiment according to the present invention.
Figure 5B:
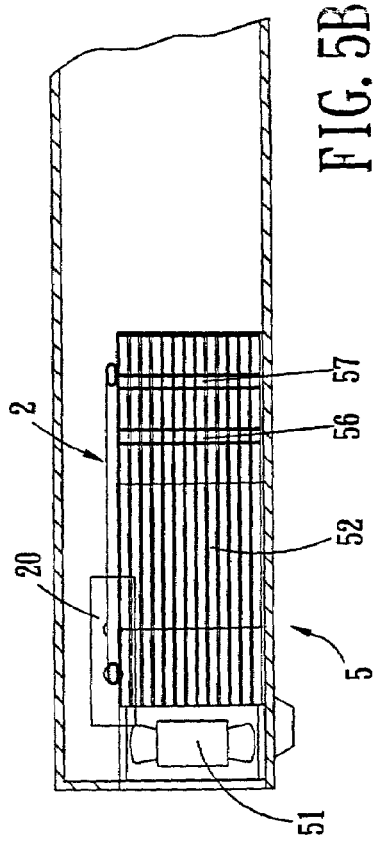
FIG. 5B is a front cross sectional view of the fifth embodiment according to the present invention.
Figure 5C:
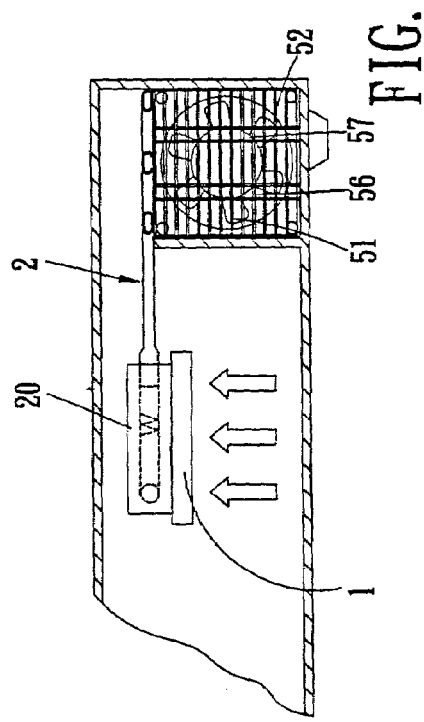
FIG. 5C is a left cross sectional view of the fifth embodiment according to the present invention.

FIG. 1 shows a simple embodiment of the present invention, wherein a heat absorbing source 1 and a loop 2 with liquid 3 are included. The radiator 5 is the loop 2 itself or associated radiating devices. The loop 2 includes a bubble generator 6 or an expanding area 4. The heat absorbing source 1 is placed at the middle point the lower section of the loop. The guide region 21 is a shift due to the shiftness of pipes. It possibly runs rightwards or leftwards. Those shown in FIG. 2 to FIG. 7 are similar to that that in FIG. 1. The differences therebetween will be described in the following: The guide region 21 in FIG. 2 has a loop with a chamfered section at the right side of the heat absorbing source 1 so that vapor moves thereto, the detail condition is shown in FIG. 3. In FIG. 4, two sides of the heat absorbing sources are unequal, and thus, the vapor will be guided leftwards. Similarly, the heat absorbing source of FIG. 5 is at the corner of the loop so that the vapor directly moves upwards. In FIG. 6, the corner at right side is larger than that at left side, this design also causes that the vapor moves rightwards. In FIG. 8, a pair of parallel loops are installed, this is similar to the embodiment of FIG. 5. The most important is, as that in FIG. 9, that the loops can be connected in series and extends. For example, two loops are installed. One loop is directly contact with one heat absorbing source 1, and then the radiator of the loop can be a heat transfer body 8. Heat is transferred to another loop through the heat transferring body 8 and thus heat is radiated by the radiator 5 at another loop. Thus, a specific serial connection is completed. Therefore, the production and assembly works are inconvenient without any arranging loop. Similarly, the same heat absorbing sources have many loops to be connected in parallel.

The length of the loop 2 is not limited. The bubble generator can be formed by the inner wall of the cross section of the loop with various shapes, or is embedding objects, or is the connections of pipes with different sizes, or is the loops connected in series or in parallel, or even is a net shape loop. The bubble generator 6 can be installed at the loop having liquid. Namely, the overheat temperature of the boiling bubble in the loop is not too high so that the actuating temperature of the boiling bubble become low. Thus, many boiling-bubbles are generated and thus, the cycling in the loop can occur easily and rapidly so that the temperature of the heat absorbing source is further reduced.

At the inner wall of the loop of the bubble generator 2 can be installed with convex or concave structures with proper sizes, such as points, blocks, surfaces, grooves, thread spirals, or other geometrical structure. Other objects can be embedded into the loop 2, such as rings, sleeves, porous sleeves, spiral wires, spiral bars, straight fiber wires, spiral bars, straight fiber wires, sintered objects (slabs, bats, blocks, sleeves, rings), screen mashes, plates, blocks, balls, particles, or other assemblies or shapes. Besides, the cross section of the pipe may be any geometrical shapes, which is regular or irregular polygons, such as round shapes, oblong shapes, triangular shapes, rectangular shapes, pentagons, polygons, star-like shapes, inward rectangular shapes, inward triangular shapes. Moreover, connecting corners can be formed between a large diameter pipe and a small diameter pipe of the loop. Therefore, the loop 2 can have the shape of single loop, double loops, multiple loops or web loops, or is a single layer loop, double layer loop, multiple layer loop, or porous loop, or the combinations thereof. Accordingly, many aspects can be used to embody the bubble generator 6. After bubbles are generated through a heat source, the fluid in the loop may be cycled rapidly. A better guide means is required for guiding bubble out of the loop and driving the cycling operation.

A guide region for easily guiding the bubbles in the loop 2 is necessary. No matter where the loop is located, a triggering structure for guiding is necessary so that bubbles generated at the rear side of the bubble generator 6 can easily separate from the guide region 21. The guide region 21 will cause the heat flow in the loop 2 to become more asymmetric both in heating positions and radiating positions or the loop itself to cause a pressure unbalance in the loop so that the generated bubbles and liquids flow toward single one direction. When the thermal flow in the loop has a higher asymmetry, the bubbles and fluid in the loop will steadily flow toward single one direction more and more apparently. Since they flow steadily toward single one direction so that the efficiency of heat exchanging is greatly improved. Therefore, the temperature in the loop can be reduced. If the symmetry about the balance of the whole loop is high, since the symmetry of the heat flow is insufficient, this will induce that the bubbles and fluid in the loop 2 swing near the heat absorbing source 1 so as to oscillate in the loop, and thus the efficiency of heat exchanging is deteriorated and therefore the system has a higher temperature. However, it must wait for a long time so that an unbalance flow is formed in the loop. Moreover, the system has a higher temperature. The heating contacting portion of the loop is made as an asymmetric structure in heat flow and thermal flow, such as asymmetric long loops, asymmetric loop corner angles, diameters of pipelines, asymmetric geometric shapes, asymmetric cooling, heating structures, or the combinations of the aforesaid structures, or asymmetric devices and structures in physics.

The fluid in the loop can be selected according to the requirement of operation and pressure. The loop can be exhausted to vacuum or not be exhausted to vacuum, which is determined according to the kinds of the fluids or the operating temperature range. The loop can have any desired shapes, outlooks, material and the combination thereof. The loop can be rigid, flexible, or the combination thereof. The loops can be connected in series or parallel, independently, multiple, or the combination of the aforesaid structures.

The radiator can be the loop itself, or the loop can be extended or prolonged to the place for heating exchanging. The radiator can be connected to the prior art radiating structures for heating exchanging.

The expanding area in the loop can be an expanding vapor space or reduced vapor space, which can be placed in the inner space of a loop with a proper size, i.e. the area without filling liquid completely in loop, or the expanding area is attached to the loop. Of course, the expanding area does not be included. It is a device capable of deformation as a proper pressure is applied. Then, the liquid can be filled in the whole loop without including the expandable area. Therefore, a volume is provided for the vapor from heating the liquid within the loop in order to avoid the breakage of the loop.

The heat absorbing source of the loop may be connected to the loop by various known ways for heat transferring. The bubble generator in various kinds of loops can be installed at the heat absorbing source to be in contact with the loop. The same effect for generating bubbles is induced. The connection ways are various, such as gluing, welding, riveting, buckling, etc., or the combination thereof.

The loop must provide a structure for charging and sealing the system liquid. The inlet and sealing way may be changed according to the shape of the loop. It is only necessary that after liquid is injected, the whole loop is sealed. The inlet can be installed at proper place since the loop is designed as a liquid, each joint must be sealed for reducing draining of liquid. In the present invention, many sets of devices can be formed in parallel or in series. Finally, a thermal equilibrium of the system is achieved. Wherein the heat absorbing source can be a heating device, and the radiator is a cooling device, while the medium of heat transfer is liquid. The power for inducing a cycling is gas so that the loop system original in a static cooling condition will absorb heat and generate bubble from the radiator directly or indirectly so as to push the liquid within the liquid to flow toward an unequilibrium condition. The loop rotates continuously. By the loop at another side, the heat of the vapor is dissipated for cooling. After heat is dissipated, the liquid flows to the hot place for performing the following heat exchange cycle. Therefore, a sufficient heat exchanger is acquired, but the dry heating of the thermal pipe will not occur so that the thermal pipe has no effect. This will not occur in the present invention, since a large amount of liquid is filled in the loop 2 of the present invention, this is absolutely different from the condition that only a slight amount of liquid 3 is in the thermal pipe.

Since the prior art thermal pipe has a capillary effect and the operation orientation. However, the loop of the present invention can be very long and many radiators are installed. That is, the heat to be dissipated can be matched with proper designed radiators. The radiators can be designed in the same position, or different positions, or is the loop itself or at special locations. The heat can be transferred to another places for heat exchanging and thus heat can be transferred to a far end. The loops can be bent, arranged, and stacked. These features can not be attained by prior art designs.

In summary, in the present invention, a simple loop serves to perform a heat exchange of thermal cycle. It can be used to many structures, from a very small electronic element to a large power plant. Therefore, the present invention is good structure of thermal transfer.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A bubble cycling heat exchanger, comprising at least one closed fluid loop having a liquid therein and being in thermal contact with a heat absorbing source through a heat conducting block, the loop having a bubble generator being a spiral wire embedded in the loop for generating bubbles in the liquid, and an externally mounted expanding area installed adjacent to and in fluid communication with the loop, the loop being formed with a guide region from which bubbles are easily separable and with a radiator, wherein responsive to overheating of the heat absorbing source, the bubble generator generates bubbles and by an unequilibrium formed at the guide region of the loop, the bubbles separate from the guide region so that the liquid in the loop flows therethrough for transferring heat from the heat absorbing source to the radiator, the loop operating continuously until a thermal equilibrium is achieved.

2. The bubble cycling heat exchanger as claimed in claim 1, wherein the loop is equipped with a fin set.

3. The bubble cycling heat exchanger as claimed in claim 2, wherein one side of the fin set is connected to a blower.

4. The bubble cycling heat exchanger as claimed in claim 2, further comprising a blower connected above the top surface of the fin set.

5. The bubble cycling heat exchanger as claimed in claim 2, further comprising a blower connected below the top surface of the fin set.

6. The bubble cycling heat exchanger as claimed in claim 1, wherein the bubble generator is installed within the heat conducting block.

7. The bubble cycling heat exchanger as claimed in claim 1, wherein the guide region is installed in the heat conducting block.

8. The bubble cycling heat exchanger as claimed in claim 1, further comprising a plurality of closed fluid loops disposed in parallel and in thermal contact with the heat absorbing source.

9. The bubble cycling heat exchanger as claimed in claim 8, wherein the plurality of loops are symmetrically located at two sides of the heat absorbing source.

* * * * *